(12) United States Patent
Watanabe et al.

(10) Patent No.: US 8,932,477 B2
(45) Date of Patent: Jan. 13, 2015

(54) COMPOUND HAVING PIEZOELECTRIC PROPERTY, PIEZOELECTRIC DEVICE, LIQUID DISCHARGE HEAD USING THE PIEZOELECTRIC DEVICE, AND ULTRASONIC MOTOR USING THE PIEZOELECTRIC DEVICE

(75) Inventors: Takayuki Watanabe, Yokohama (JP); Jumpei Hayashi, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 488 days.

(21) Appl. No.: 13/266,221

(22) PCT Filed: Apr. 27, 2010

(86) PCT No.: PCT/JP2010/057842
§ 371 (c)(1),
(2), (4) Date: Oct. 25, 2011

(87) PCT Pub. No.: WO2010/126158
PCT Pub. Date: Nov. 4, 2010

(65) Prior Publication Data
US 2012/0043853 A1 Feb. 23, 2012

(30) Foreign Application Priority Data
Apr. 30, 2009 (JP) .................... 2009-111123

(51) Int. Cl.
*C04B 35/495* (2006.01)
*C04B 35/453* (2006.01)
(Continued)

(52) U.S. Cl.
CPC ............ *C01G 35/006* (2013.01); *C04B 35/495* (2013.01); *H01L 41/187* (2013.01); *C04B 2235/3201* (2013.01); *C04B 2235/3208* (2013.01); *C04B 2235/3215* (2013.01); *C04B 2235/3217* (2013.01); *C04B 2235/3232* (2013.01); *C04B 2235/3239* (2013.01); *C04B 2235/3244* (2013.01); *C04B 2235/3251* (2013.01); *C04B 2235/3255* (2013.01); *C04B 2235/3258* (2013.01); *C04B 2235/3272* (2013.01); *C04B 2235/3275* (2013.01);
(Continued)

(58) Field of Classification Search
USPC ....................... 252/62.9 R; 501/135
See application file for complete search history.

(56) References Cited

FOREIGN PATENT DOCUMENTS

| JP | 11-278932 | 10/1999 |
|---|---|---|
| JP | 2000-281443 | 10/2000 |

(Continued)

OTHER PUBLICATIONS

Wuli Huaxue Xuebao, Structual and dielectric properties of a niobate Ba3NaBiNb10O30, Acta Phys.-Chim.Sin., 2001, 17(5): 457-459.

Fu et al., Polarization rotation mechanism for ultrahigh electromechanical response in single-crystal piezoelectrics, Nature, vol. 403, p. 281 (2000).

Oliver et al., Ferroelectric Properties of Tungsten Bronze Morphotropic Phase Boundary System, Journal of American Ceramic Society, vol. 72, p. 202 (1989).

(Continued)

*Primary Examiner* — Carol M Koslow
(74) *Attorney, Agent, or Firm* — Canon U.S.A. Inc., IP Division

(57) ABSTRACT

A compound having a tungsten bronze structure exhibiting a high Curie temperature, good insulating resistance and mechanical quality factor, and excellent piezoelectric properties is provided. The compound contains a tungsten bronze structure oxide represented by general formula (1):

$$x(BaB_2O_6)\text{-}y(CaB_2O_6)\text{-}z\{(Bi_{1/2}C_{1/2})B_2O_6\} \quad (1)$$

where B represents at least one of Nb and Ta; C represents at least one of Na and K; $x+y+z=1$; x satisfies $0.2 \leq x \leq 0.85$; y satisfies $0 \leq y \leq 0.5$; and z satisfies $0 < z \leq 0.8$.

11 Claims, 9 Drawing Sheets

(51) Int. Cl.
*H01L 41/00* (2013.01)
*C01G 35/00* (2006.01)
*H01L 41/187* (2006.01)

(52) U.S. Cl.
CPC ... *C04B2235/3298* (2013.01); *C04B 2235/605* (2013.01); *C04B 2235/76* (2013.01); *C04B 2235/787* (2013.01); *C04B 2235/80* (2013.01); *C04B 2235/81* (2013.01); *C01P 2002/72* (2013.01); *C01P 2006/40* (2013.01)
USPC ..................................... 252/62.9 R; 501/135

(56) References Cited

FOREIGN PATENT DOCUMENTS

| | | |
|---|---|---|
| JP | 3720572 B2 | 11/2005 |
| JP | 2006-182643 | 7/2006 |

OTHER PUBLICATIONS

Muehlberg et al., Phase equilibria, crystal growth and characterization of the novel ferroelectric tungsten bronzes CaxBa1-xNb2O6 (CBN) and CaxSryBa1-x-yNb2O6 (CSBN), Journal of Crystal Growth, vol. 310, p. 2288 (2008).

Fang et al., Synthesis and dielectric properties of Ba3NaBiNb10O30 ceramics, Journal Wuhan University of Technology, Materials Science Edition Mar. 2003.

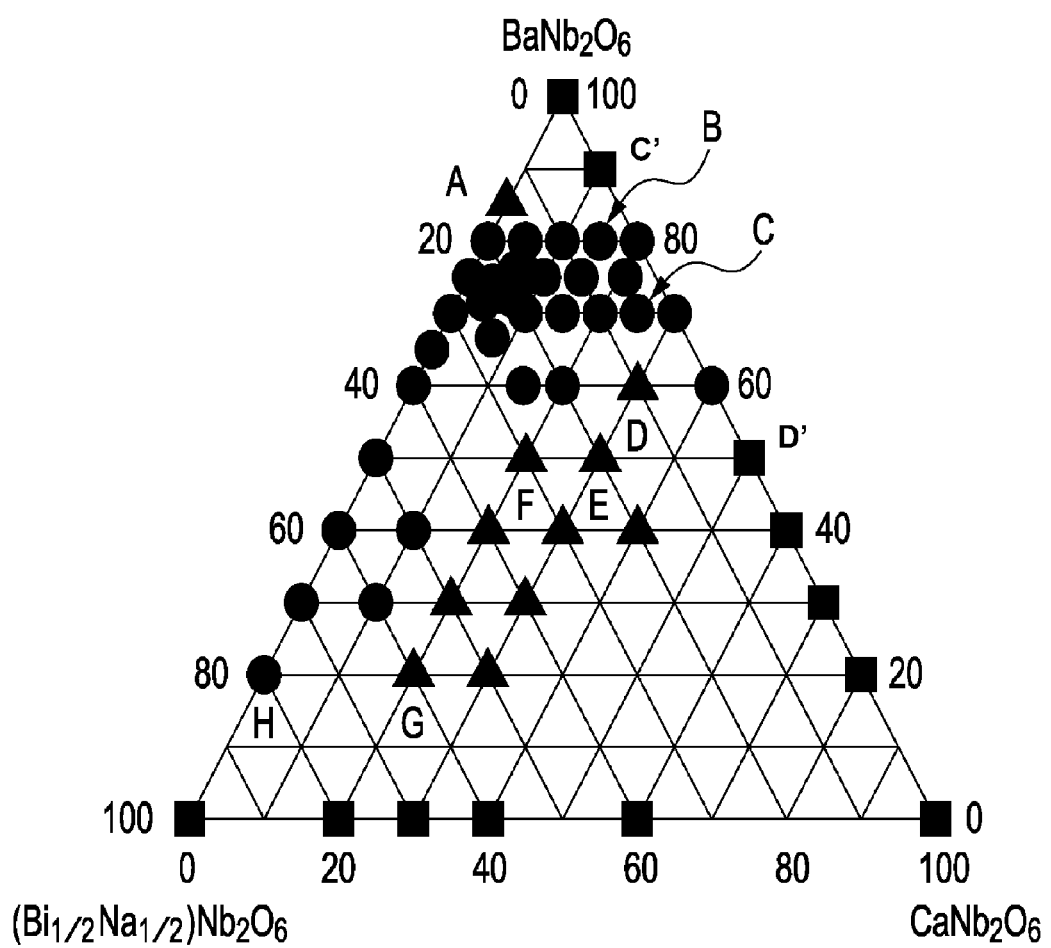

y,(0.75−y)BaNb$_2$O$_6$−yCaNb$_2$O$_6$−0.25(Bi$_{1/2}$Na$_{1/2}$)Nb$_2$O$_6$

COMPOUND HAVING PIEZOELECTRIC PROPERTY, PIEZOELECTRIC DEVICE, LIQUID DISCHARGE HEAD USING THE PIEZOELECTRIC DEVICE, AND ULTRASONIC MOTOR USING THE PIEZOELECTRIC DEVICE

TECHNICAL FIELD

The present invention relates to a compound that can be used as a piezoelectric material. In particular, the present invention relates to a novel piezoelectric material including a lead-free metal oxide.

BACKGROUND ART

For the purposes of this specification, the term "tungsten bronze structure" refers not to $H_xWO_3$ (tungsten bronze) or hexagonal tungsten bronze structure (HTB) that are known for their electrochromic phenomena, but to what is generally known as tetragonal tungsten bronze structure (TTB). Note that the term "tetragonal tungsten bronze structure" is the name given to a particular crystal structure and does not immediately mean that the referred crystal is always tetragonal. There are orthorhombic materials also.

Regarding tungsten bronze structure oxides, the settings of the unit cell differ between the tetragonal and orthorhombic systems. In this description, the settings of the tetragonal system are used to indicate the crystallographic planes, crystallographic orientations, and diffraction.

In this specification, the term "morphotropic phase boundary" refers not only to a boundary at which the crystal system changes depending on the composition, which is a general definition, but also to a boundary or region at which the space group changes depending on the composition.

In this specification, the term "Curie temperature" refers not only to a temperature beyond which a material loses its ferroelectricity, which is a general definition, but also to a temperature at which the maximum dielectric constant is observed when measured by varying the measurement temperature using a minute alternating electric field of a particular frequency.

In this specification, the term "mol %" refers to a percentage of the amount of a designated element relative to the total amount of the substances occupying the designated sites.

The majority of piezoelectric materials used in various piezoelectric devices are perovskite piezoelectric materials containing lead, represented by lead zirconate titanate. However, efforts have been made to replace the lead-containing piezoelectric materials with lead-free piezoelectric materials. This is because it has been pointed out that when piezoelectric devices containing lead are discarded and exposed to acid rain, the lead component in the piezoelectric materials elutes into earth, possibly impacting the ecosystem. Proposals regarding lead-free piezoelectric materials have thus been made.

Regarding the perovskite piezoelectric materials, utilization of a morphotropic phase boundary (simply referred to as "MPB" hereinafter) has been investigated to improve the piezoelectric properties. For example, a group led by Fu reports in NPL 1 that the difference in free energy between crystals is small and this free energy changes depending on the applied electric field at the MPB, i.e., the boundary of different crystal systems. As a result, field-induced phase transition can be developed by the electric field. When the orientation of the spontaneous polarization axis, which is the strain direction of crystals, is rotated following the phase transition, a large displacement occurs. It is believed that the rotation of the spontaneous polarization is one of the mechanisms that impart high piezoelectric properties to the perovskite piezoelectric materials at the MPB.

Regarding piezoelectric materials other than those having the perovskite structure, tungsten bronze structure piezoelectric materials are known to have MPB. For example, a group led by Oliver reports in NPL 2 that they found MPB between $BaNb_2O_6$ and $PbNb_2O_6$. Some of the lead-containing tungsten bronze structure piezoelectric materials have a spontaneous polarization axis in the a-b plane orthogonal (inclined by 90°) to the c axis. When a tungsten bronze structure piezoelectric material containing lead and having a spontaneous polarization axis in the a-b plane is dissolved into a tungsten bronze structure piezoelectric material having a spontaneous polarization in the c axis direction, a MPB at which the spontaneous polarization axis direction changes can be formed. Actually, the improvements on piezoelectric properties at the MPB have been confirmed. However, regarding lead-free tungsten bronze structure piezoelectric materials, only those having a spontaneous polarization axis extending in the c axis direction have been known irrespective of the crystal system. Thus, even if a MPB is formed, a giant displacement caused by rotation of the spontaneous polarization axis can rarely be used. Therefore, discovery of lead-free tungsten bronze structure piezoelectric materials having spontaneous polarization axes oriented in directions other than the c axis direction (also referred to as "non-c axis" hereinafter) is desirable to use the rotation of the spontaneous polarization axis to improve the piezoelectric properties.

A group led by Muehlberg discloses in NPL 3 a solid solution system of $BaNb_2O_6$ and $CaNb_2O_6$ as a lead-free tungsten bronze structure piezoelectric material. However, the piezoelectric properties of this material are significantly low.

PTL discloses a piezoelectric ceramic composition containing, as a main component, a tungsten bronze structure complex oxide that contains metal elements, Na, Ba, Bi, and Nb, in which the ratio of Bi to the total weight is 3 to 6 wt % on a metal basis and the Na content is significantly larger than the Bi content. This piezoelectric ceramic composition is based on a solid solution system represented by $x(NaNbO_3)$-$y(BaNb_2O_6)$-$z(BiNb_3O_9)$. A problem with this solid solution system is that the mechanical quality factor (Qm) that significantly affects the driving performance of the piezoelectric oscillators, resonators and transducers is as low as about 100. Moreover, no description related to the direction of the spontaneous polarization is contained.

The present invention provides a compound having a tungsten bronze structure exhibiting a high Curie temperature, good insulating resistance and mechanical quality factor, and excellent piezoelectric properties.

The present invention also provides a novel compound having a lead-free tungsten bronze structure having a spontaneous polarization axis inclined with respect to the c axis of the crystal.

CITATION LIST

Patent Literature

PTL Japanese Patent Laid-Open No. 2000-281443

Non Patent Literature

NPL 1 Fu et al., Nature, vol. 403, p. 281 (2000)
NPL 2 Oliver et al., Journal of American Ceramic Society, vol. 72, p. 202 (1989)
NPL 3 Muehlberg et al., Journal of Crystal Growth, vol. 310, p. 2288 (2008)

SUMMARY OF INVENTION

A first aspect of the present invention provides a compound containing a lead-free tungsten bronze structure oxide represented by general formula (1):

$$x(BaB_2O_6)\text{-}y(CaB_2O_6)\text{-}z\{(Bi_{1/2}C_{1/2})B_2O_6\} \qquad (1)$$

where B represents at least one of Nb and Ta; C represents at least one of Na and K; $x+y+z=1$; $0.2 \le x \le 0.85$; $0 \le y \le 0.5$; and $0 < z \le 0.8$.

A second aspect of the present invention provides a compound containing a lead-free tungsten bronze structure oxide represented by general formula (2):

$$x(BaNb_2O_6)\text{-}y(CaNb_2O_6)\text{-}z\{(Bi_{1/2}Na_{1/2})Nb_2O_6\}$$

where $x+y+z=1$, $0.2 \le x \le 0.85$, $0 \le y \le 0.5$, and $0 < z \le 0.8$.

A third aspect of the present invention provides piezoelectric material containing a lead-free tungsten bronze structure oxide having a spontaneous polarization axis inclined with respect to the c axis of a unit cell.

A fourth aspect of the present invention provides a piezoelectric material containing a lead-free tungsten bronze structure oxide having a morphotropic phase boundary, wherein the angle of inclination of the spontaneous polarization axis with respect to the c axis changes at the morphotropic phase boundary.

The present invention provides a lead-free novel compound that has a low impact on the ecosystem. The present invention also provides a compound having a lead-free tungsten bronze structure having a spontaneous polarization axis inclined with respect to the c axis.

BRIEF DESCRIPTION OF DRAWINGS

FIG. 3 is a diagram showing the composition and constitutional phases of a piezoelectric material.

DESCRIPTION OF EMBODIMENTS

Figure 1A:
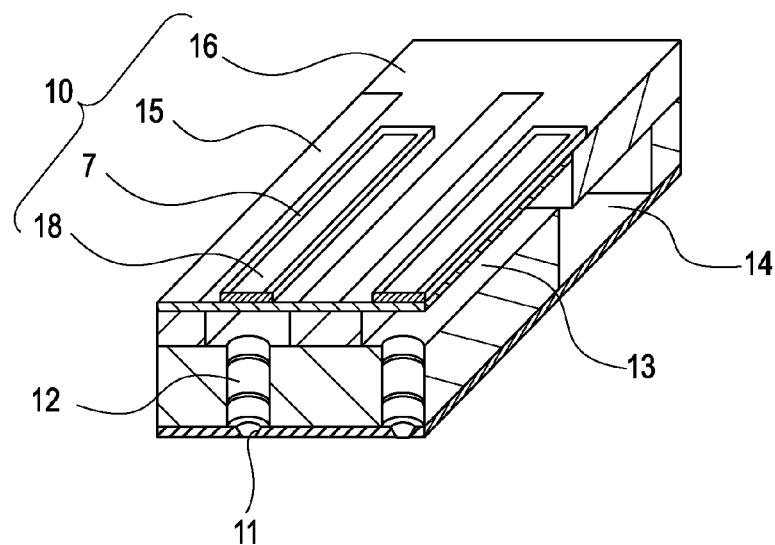
FIGS. 1A and 1B are diagrams showing the structure of a liquid discharge head and FIGS. 1C and 1D are diagrams showing the structures of ultrasonic motors.

Embodiments according to aspects of the present invention will now be described. Although the compound according to aspects of the present invention has a variety of usage including capacitor materials and piezoelectric materials, a piezoelectric material is used as an example in the description below. Naturally, the usage of the compound is not limited to the piezoelectric material.

A piezoelectric material according to one embodiment contains a lead-free tungsten bronze structure oxide containing Ba, Ca, Bi, Na and/or K, and Nb and/or Ta.

The tungsten bronze structure oxide is represented by general formula (1) below:

$$x(BaB_2O_6)\text{-}y(CaB_2O_6)\text{-}z\{(Bi_{1/2}C_{1/2})B_2O_6\} \qquad \text{General Formula (1)}$$

where B represents at least one of Nb and Ta; C represents at least one of Na and K; $x+y+z=1$; $0.2 \le x \le 0.85$; $0 \le y \le 0.5$; and $0 < z \le 0.8$.

The primary phase of the above-presented substance is a crystal having a tungsten bronze structure. For the purposes of this specification, "primary phase" means that when this piezoelectric material is subjected to powder X-ray diffraction analysis, the peak having the maximum diffraction intensity is derived from the tungsten bronze structure. The substance can have a "single phase" where all or nearly all of crystals have a tungsten bronze structure.

When $z>0$, i.e., when the $(Bi_{1/2}C_{1/2})B_2O_6$ component is contained, crystal strains generated by 6 s orbital lone pairs of Bi are introduced and the piezoelectric properties are improved. Introduction of Bi also causes the spontaneous polarization direction to be inclined with respect to the c axis direction. This is presumably because the 6 s orbital lone pairs of Bi act repulsively with surrounding ions and significantly distort the $NbO_6$ or $TaO_6$ oxygen octahedral, thereby causing a spontaneous polarization to appear in the a-b plane. Examples of the elements that have an inert-pair effect other than Bi include Sn and Tl. Among these, Bi is suitable for use from the viewpoints of stability of the oxidation state and toxicity.

As described above, introduction of Bi causes the spontaneous polarization axis direction of the tungsten bronze structure oxide to be inclined with respect to the c axis direction.

However, since Bi is trivalent, a monovalent alkali metal element can be used together to neutralize the valence and to address the problem associated with charges.

When the composition is within the above-described range, superior characteristics can be achieved in terms of Curie temperature, insulation resistance, and mechanical quality factor.

The piezoelectric material will now be described along with a general descriptions on tungsten bronze structures and the inclination of the spontaneous polarization axis with respect to the c axis.

In general, tungsten bronze structure oxides are represented by the chemical formula, $A_{4-6}B_{10}O_{30}$. In a unit cell of a tungsten bronze structure, Ba, Ca, Bi, and element C mainly occupy one of two particular types of positions called "A1 site" (12-coordinated site rectangular in shape when viewed in the c axis direction) and "A2 site" (15-coordinated site pentagonal in shape when viewed in the c axis direction) that are present near the oxygen octahedrons. Element B mainly occupies a particular position called "B site" and is present inside the oxygen octahedron.

The compound represented by general formula (1) is a solid solution of two or more oxides represented by $A_5B_{10}O_{30}$ and can also be expressed as $(Ba_xCa_y Bi_{z/2}C_{z/2})_5B_{10}O_{30}$.

In general formula (1), the ratio of the moles of the elements occupying the A1 site and the A2 site to the moles of the element occupying the B site is expressed to be an ideal composition ratio, i.e., 1:2. When the sum of the moles of the elements occupying the A1 and A2 sites is excessive or deficient relative to the moles of the element occupying the B site, the excess component may precipitate in crystal grain boundaries or cause abnormal grain growth, or the deficient component may decrease the density of a sintered body, form defective sites, or generate oxygen vacancies, thereby possibly adversely affecting the insulating property, for example. The allowable range of the molar ratio of the amount of the A site elements to the B site elements is, for example, A site/B site=0.45 or more and 0.6 or less. When the amount of the A site elements is outside this range, not only the insulating property but also piezoelectric properties are significantly degraded.

In general formula (1), the ratio of the moles of Bi to the moles of element C is expressed to be an ideal composition ratio, i.e., 1:1. When element C is excessive or deficient relative to Bi, the excess component may precipitate in crystal grain boundaries or the deficient component may form defects and generate oxygen vacancies, thereby possibly adversely affecting the insulating property, for example. The allowable range of the molar ratio of Bi to element C is, for example, Bi/element C=0.9 or more and 1.2 or less. When the molar ratio is outside this range, not only the insulating property but also piezoelectric properties are significantly degraded.

B in general formula (1) is selected from Nb, Ta, and a combination of Nb and Ta. B may be Nb since the sintering temperature is low compared to when B is Ta and since B is less expensive. Element C in general formula (1) is selected from Na, K, and a combination of Na and K. Element C may be Na since the composition range that can achieve a tungsten bronze structure single phase is wider, a high-density specimen can be easily obtained, and the possibility of deliquescence is low.

The degree of (001) orientation in terms of Lotgering factor determined by X-ray diffraction analysis may be 0.07 or more and 1.00 or less. This is because when a ceramic is oriented in the spontaneous polarization axis direction, the amplitude of the voltage needed for the polarization process can be suppressed. In contrast, when the Lotgering factor is smaller than 0.07, the conditions needed for the polarization process are the same as when the specimen has no orientation (zero Lotgering factor). The Lotgering factor can be 0.20 or more and 1.00 or less since the voltage needed for the polarization process can be further decreased.

The temperature at which the dielectric constant of the piezoelectric material measured at 1 MHz is maximum can be 100° C. or more. The measurement frequency of 1 MHz provides a highly reliable evaluation, since only few leakage current components can follow this frequency. The temperature at which the dielectric constant is maximum at this frequency may be 100° C. or more since this means that the device can be used at temperatures lower than 100° C.

The direction in which the spontaneous polarization axis is inclined is not particularly limited but may be inclined with respect to the c axis. This is because high piezoelectric properties can be effectively obtained at MPB when combined with a material having a spontaneous polarization axis direction parallel to the c axis. The spontaneous polarization axis may be inclined with respect to the c axis at an inclination angle of 45° or more. The more the spontaneous polarization axis is inclined with respect to the c axis, the greater the changes in the spontaneous polarization axis direction at the MPB, thereby enhancing the piezoelectric properties.

That the spontaneous polarization axis is inclined with respect to the c axis can be examined by the following process. In general, polarization does not switch under application of an external electric field in a direction orthogonal to the spontaneous polarization axis of a ferroelectric material. In such a case, the polarization of the dielectric material changes linearly versus the applied electric field and shows no hysteresis loops as observed for paraelectrics. A hysteresis characteristic of ferroelectric materials is not observed and the dielectric material behaves like paraelectrics.

The orientation of the spontaneous polarization axis can be evaluated by investigating the anisotropy of the polarization switching. In particular, electric fields are applied in the [001] direction of the crystal and the [hk0] direction orthogonal to the [001] direction and how the polarization changes with respect to the external electric fields is measured.

For example, when the spontaneous polarization axis is oriented in the c axis direction, a hysteresis is observed by measuring the relationship between the polarization and electric field by application of an electric field in the [001] direction. However, no hysteresis is observed in the relationship between the polarization and the electric field when the electric field is applied in the [hk0] direction orthogonal to the spontaneous polarization axis.

When the spontaneous polarization axis is inclined with respect to the c axis and lies between the [001] direction and the [hk0] direction, the observed polarization changes nonlinearly versus the applied electric field and displays a hysteresis under application of electric fields in both the [001] direction and the [hk0] direction.

In order to simplify the fabrication of the piezoelectric material and adjust the physical properties of the piezoelectric material, an element other than Nb and Ta may be contained in B. This element to be contained in B is preferably a trivalent or tetravalent metal element. Examples thereof include Fe, Al, Co, Ti, and Zr. The content of the element to be contained in B is preferably 20 mol % or less and more preferably 5 mol % or less of the B site elements. The decrease in the total valence of the B site elements may be set-off by increasing the amount of the A site elements.

Elements such as V, W, and Co may be added to simplify the fabrication of the piezoelectric material and adjust the physical properties of the piezoelectric material. The amount of this additive element may be 10 mol % or less relative to 1 mole of the tungsten bronze structure oxide. When the amount is more than 10 mol %, impurity phases may be generated and the insulting property may be degraded.

The Curie temperature of the piezoelectric material is preferably room temperature (20° C.) or more and 500° C. or less and more preferably 100° C. or more and 400° C. or less. When the Curie temperature is 100° C. or more, a device made using the piezoelectric material exhibits little changes in the device performance versus temperature. When the Curie temperature is 400° C. or less, a material can be easily polarized to be used in a device.

The crystal system of the tungsten bronze structure oxide represented by general formula (1) may at least include an orthorhombic structure. This is because the Curie temperature of such an oxide is higher than the Curie temperature of the tungsten bronze structure oxide having a tetragonal structure only.

The piezoelectric material may have a single phase but may contain a piezoelectric material constituted by other crystal systems. Examples of this piezoelectric material include $BaTiO_3$, $(Bi_{1/2}Na_{1/2})TiO_3$, $(Bi_{1/2}K_{1/2})TiO_3$, $KNbO_3$, $NaNbO_3$, $LiNbO_3$, and $BiFeO_3$ having perovskite structures, and bismuth layered ferroelectric materials such as $Ba_4Ti_3O_{12}$, $SrBi_4Ti_4O_{15}$, and $CaBi_4Ti_4O_{15}$.

The desirable preferred crystal orientation of the piezoelectric material is (001) or (hk0) where h and k are each individually an integer of 0 or more but never simultaneously zero. This is because the spontaneous polarization axis of a tungsten bronze structure ferroelectric material mainly lies in the [001] or [hk0] direction. In other words, when the piezoelectric material is oriented in the spontaneous polarization axis direction, the polarization becomes maximum and maximum piezoelectric properties can be obtained in general. Moreover, the polarization process is facilitated. The term "preferred crystal orientation" means that the Lotgering factor determined by X-ray diffraction analysis is 0.07 or more and 1.00 or less.

The piezoelectric material may take a form of a single crystal, a sintered body, or a film formed on a substrate.

The grain diameter of the piezoelectric material is desirably large so that various grain orientation techniques can be used. However, when the crystal grain diameter exceeds 100 μm, the strength may not be sufficient for cutting or polishing. Thus the grain diameter may be about 0.3 μm to about 100 μm.

When the piezoelectric material is used as a film formed on a substrate, the thickness of the piezoelectric material is preferably 200 nm or more and 10 μm or less and more preferably 300 nm or more and 3 μm or less. When the thickness of the piezoelectric material is 200 nm or more and 10 μm or less, an electromechanical conversion function sufficient for a piezoelectric device can be obtained and the density of the piezoelectric device can be increased.

The method for forming this film is not particularly limited. Examples of the method include a chemical solution deposition (CSD) technique, a sol-gel technique, a metal organic chemical vapor deposition (MOCVD) technique, a sputtering technique, a pulsed laser deposition (PLD) technique, a hydrothermal synthesis technique, and aerosol deposition (AD) technique. The chemical solution decomposition technique and the sputtering technique are suitable since large-area films can be easily formed.

The substrate on which the piezoelectric material is formed may be a single crystal substrate selectively oriented in the (001) or (111) plane.

When a single crystal substrate oriented in a particular plane is used, the piezoelectric material forming a film on the substrate surface can be mainly oriented in the same direction. When the piezoelectric material is oriented in the (001) or (100)/(010) plane, the polarization moments align in a direction perpendicular to the film and thus the piezoelectric effect can be enhanced.

Next, a piezoelectric device using the piezoelectric material is described.

Figure 1B:
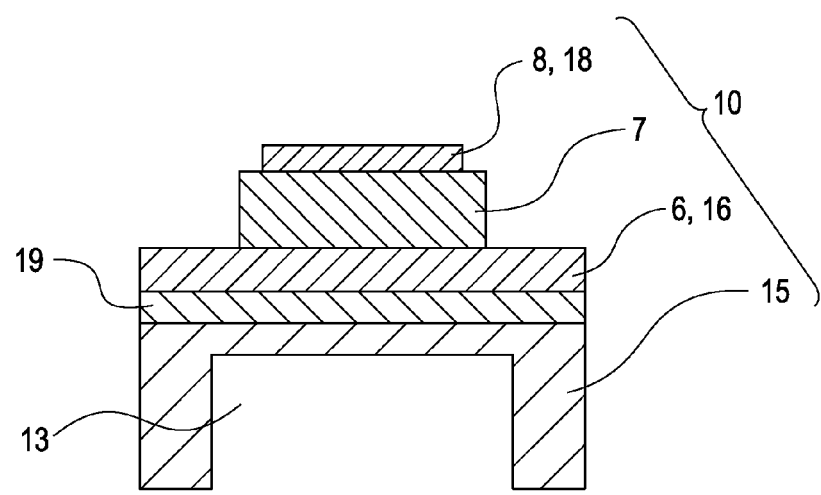

Referring to FIG. 1B, a piezoelectric device includes at least a substrate 15, a first electrode film 6, a piezoelectric material 7, and a second electrode film 8. The piezoelectric material 7 is patterned as necessary as shown in FIG. 1A.

A liquid discharge head according to an aspect of the present invention will now be described with reference to FIGS. 1A and 1B. The liquid discharge head includes the piezoelectric device described above. FIG. 1A is a schematic view of the liquid discharge head. The liquid discharge head includes a discharge port 11, a communication hole 12 connecting an individual liquid reservoir 13 to the discharge port 11, a common liquid reservoir 14, an oscillation plate 15, and a piezoelectric device 10. The piezoelectric device 10 has an rectangular shape as shown in the drawing but may have any other shape, such as elliptical, circular, rectangular parallel piped, etc. In general, the piezoelectric material 7 has a shape corresponding to the shape of the individual liquid reservoir 13.

The piezoelectric device 10 included in the liquid discharge head and nearby parts will now be described in further detail by referring to FIG. 1B. FIG. 1B is a cross-sectional view of the piezoelectric device taken in the width direction of the liquid discharge head shown in FIG. 1A. Although the cross-sectional shape of the piezoelectric device 10 is rectangular in this embodiment, the shape may be a trapezoidal or reversed trapezoidal shape.

In the drawing, the first electrode film 6 is used as a lower electrode film 16 and the second electrode film 8 is used as an upper electrode film 18. However, arrangement of the first electrode film 6 and the second electrode film 8 is not limited to this. The first electrode film 6 may be used as the lower electrode film 16 or the upper electrode film 18 and the second electrode film 8 may be used as the upper electrode film 18 or the lower electrode film 16. The oscillation plate 15 may be a substrate included in the piezoelectric device 10. These differences in naming are derived from the device fabrication method and effects of the present invention can still be obtained in any cases. A buffer layer 19 may be interposed between the oscillation plate 15 and the lower electrode film 16.

According to this liquid discharge head, the oscillation plate 15 moves up and down by expansion and contraction of the piezoelectric thin film and applies a pressure on the liquid contained in the individual liquid reservoir 13 so that the liquid is discharged from the discharge port 11. This head can be used in printers and for electronic device fabrication.

The thickness of the oscillation plate 15 is 1.0 μm or more and 15 μm or less and preferably 1.5 μm or more and 8 μm or less. The material for the oscillation plate 15 is a substrate and may be composed of silicon. The buffer layer and the electrode layer on the silicon substrate may form part of the oscillation plate. The silicon oscillation plate may be doped with boron or phosphorus.

The thickness of the buffer layer 19 is 5 nm or more and 300 nm or less and more preferably 10 nm or more and 200 nm or less.

The size of the discharge port 11 is 5 μm or more and 40 μm or less in diameter. The shape of the discharge port 11 is circular but may be a star shape, a rectangular shape, or a triangular shape.

An ultrasonic motor using the piezoelectric device will now be described.

Figure 1C:
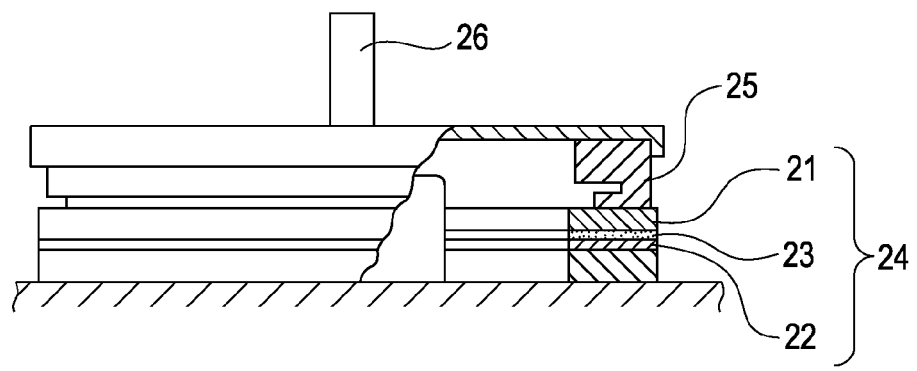

FIG. 1C shows an ultrasonic motor including a piezoelectric material constituted by a single plate. The ultrasonic motor includes an oscillator 24, a rotor 25 abutting the sliding surface of the oscillator 24 under pressure from a pressurizing spring not shown in the drawing, and an output shaft 26 integrally formed with the rotor 25. The oscillator 24 includes a metal elastic ring 21, a piezoelectric device 22 which is the same piezoelectric device as one described above, and an organic adhesive 23 (epoxy- or cyanoacrylate-based adhesive, for example) bonding the piezoelectric device 22 onto the elastic ring 21.

When an alternating current is applied by a two-phase (phases differ by $\pi/2$) power supply onto the piezoelectric material, a bending travelling wave occurs in the oscillator 24, and individual points on the sliding surface of the oscillator 24 undergo elliptical motions. When the rotor 25 is pressure-contacted with the sliding surface of the oscillator 24, the rotor 25 receives friction force from the oscillator 24 and rotates in the direction of the elliptical motions on the sliding surface of the oscillator 24. An object to be driven not shown in the drawing is joined to the output shaft 26 by coupling or the like and is driven by the turning force of the rotor 25. This type of motors utilizes the principle that an elastic body such as a metal, joined to a piezoelectric device becomes bent by expansion and contraction of a piezoelectric material due to a transverse piezoelectric effect that occurs when a voltage is applied to the piezoelectric material.

Figure 1D:
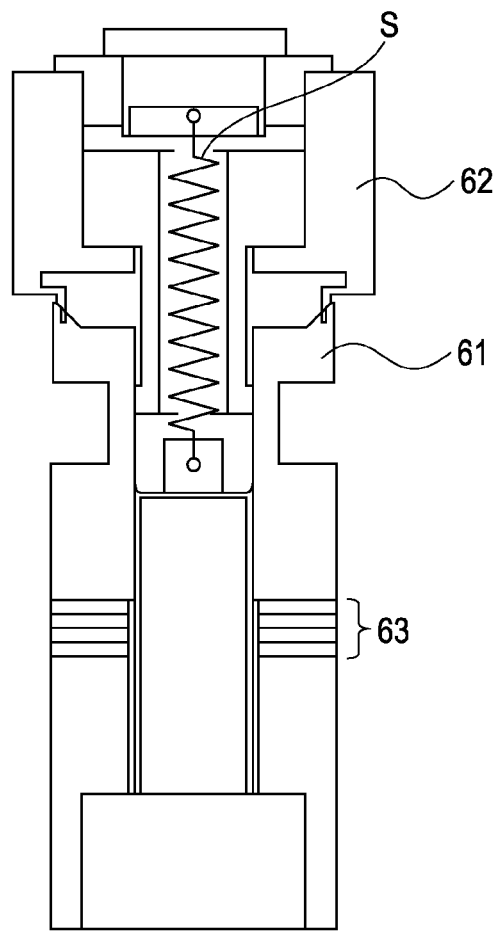

FIG. 1D shows an example of an ultrasonic motor including a piezoelectric material having a multilayer structure. In FIG. 1D, an oscillator 61 is composed of a metal material. A plurality of piezoelectric materials 63 are interposed between cylindrical metal blocks and metal blocks are joined with a bolt to fix the piezoelectric materials 63 therebetween and to make an oscillator. When alternating voltage having different phases is applied to a driving piezoelectric material of the piezoelectric device, the oscillator 61 excites two vibrations orthogonal to each other and these vibrations are combined to form circular vibrations for driving at the tip of the oscillator. Note that an annular groove is formed in the upper portion of the oscillator 61 so that the displacement of the vibration for driving can be increased.

A rotor 62 pressure-contacts the oscillator 61 due to a pressurizing sprint S so as to obtain friction force for driving. The rotor 62 is rotatably supported by bearings.

As described above, the piezoelectric device can be used in a liquid discharge head or an ultrasonic motor. A liquid discharge head that has a nozzle density and discharge power equal to or superior to those using lead-based piezoelectric materials can be provided by the lead-free piezoelectric material containing a tungsten bronze structure oxide. Moreover, an ultrasonic motor that has a driving force and durability equal to or superior to those using lead-based piezoelectric materials can be provided by the lead-free piezoelectric material containing a tungsten bronze structure oxide. The piezoelectric material can also be used in devices other than the liquid discharge heads and motors, such as ultrasonic oscillators, piezoelectric actuators, piezoelectric sensors, and ferroelectric memories.

EXAMPLES

The piezoelectric material will now be described in further detail by using examples below. The scope of the present invention is not limited by the examples below.

TABLE 1

| | X (*1) | y (*2) | z (*3) | Mark | Phase | Tc (° C.) | Resistivity ($10^9$ Ωcm) | Piez. *4 |
|---|---|---|---|---|---|---|---|---|
| Co. Ex. 1 | 0.9 | 0.1 | 0 | C' | N | — | — | X |
| Ex. 1 | 0.85 | 0 | 0.15 | A | M | 360 | 0.4 | ○ |
| Ex. 2 | 0.8 | 0.05 | 0.15 | | S | 360 | 10 | ○ |
| Ex. 3 | 0.8 | 0.1 | 0.1 | | S | 360 | 1.2 | ○ |
| Ex. 4 | 0.8 | 0.15 | 0.05 | B | S | 380 | 20 | ○ |
| Co. Ex. 2 | 0.8 | 0.2 | 0 | | S | 290 | — | Δ |
| Ex. 5 | 0.8 | 0 | 0.2 | | S | 300 | 0.73 | ○ |
| Ex. 6 | 0.75 | 0 | 0.25 | | S | 190 | 2 | ○ |
| Ex. 7 | 0.75 | 0.1 | 0.15 | | S | 270 | 1.8 | ○ |
| Ex. 8 | 0.75 | 0.15 | 0.1 | | S | 290 | 2.8 | ○ |
| Ex. 9 | 0.75 | 0.2 | 0.05 | | S | 310 | 6.7 | ○ |
| Ex. 10 | 0.74 | 0.01 | 0.25 | | S | 300 | 26 | ○ |
| Ex. 11 | 0.73 | 0.02 | 0.25 | | S | 250 | 50 | ○ |
| Ex. 12 | 0.71 | 0.04 | 0.25 | | S | 110 | 403 | ○ |
| Ex. 13 | 0.7 | 0 | 0.3 | | S | 20 | 105 | ○ |
| Ex. 14 | 0.7 | 0.1 | 0.2 | | S | 140 | 1.6 | ○ |
| Ex. 15 | 0.7 | 0.15 | 0.15 | | S | 160 | 2.1 | ○ |
| Ex. 16 | 0.7 | 0.2 | 0.1 | | S | 160 | 65 | ○ |
| Ex. 17 | 0.7 | 0.25 | 0.05 | C | S | 220 | 21 | ○ |
| Co. Ex. 3 | 0.7 | 0.3 | 0 | | S | 250 | — | Δ |
| Ex. 18 | 0.68 | 0.07 | 0.25 | | S | 70 | 50 | ○ |
| Ex. 19 | 0.65 | 0 | 0.35 | | S | — | 170 | ○ |
| Ex. 20 | 0.6 | 0 | 0.4 | | S | 50 | 62 | ○ |
| Ex. 21 | 0.6 | 0.15 | 0.25 | | S | 40 | 400 | ○ |
| Ex. 22 | 0.6 | 0.2 | 0.2 | | S | 60 | — | ○ |
| Ex. 23 | 0.6 | 0.3 | 0.1 | D | M | 130 | 430 | ○ |
| Co. Ex. 4 | 0.6 | 0.4 | 0 | | S | 210 | — | Δ |

TABLE 1-continued

| | X (*1) | y (*2) | z (*3) | Mark | Phase | Tc (° C.) | Resistivity ($10^9$ Ωcm) | Piez. *4 |
|---|---|---|---|---|---|---|---|---|
| Ex. 24 | 0.5 | 0 | 0.5 | | S | 100 | 1.7 | ○ |
| Ex. 25 | 0.5 | 0.2 | 0.3 | F | M | 80 | 820 | ○ |
| Ex. 26 | 0.5 | 0.3 | 0.2 | e | M | 50 | 4700 | ○ |
| Co. Ex. 5 | 0.5 | 0.5 | 0 | D' | N | — | — | X |
| Ex. 27 | 0.4 | 0 | 0.6 | | S | 200 | 0.2 | ○ |
| Ex. 28 | 0.4 | 0.1 | 0.5 | | S | 140 | 1.1 | ○ |
| Ex. 29 | 0.3 | 0 | 0.7 | | S | 100 | 0.06 | Δ |
| Ex. 30 | 0.3 | 0.1 | 0.6 | | S | 100 | 4.6 | Δ |
| Ex. 31 | 0.2 | 0 | 0.8 | H | S | 100 | — | Δ |
| Ex. 32 | 0.2 | 0.2 | 0.6 | G | M | 110 | — | Δ |
| Co. Ex. 6 | 0 | 0 | 1 | | N | — | — | X |
| Co. Ex. 7 | 0 | 0.2 | 0.8 | | N | — | — | X |

Co. Ex.: Comparative Example
Ex.: Example
*1 x: as in x ($BaNb_2O_6$)
*2 y: as in y ($CaNb_2O_6$)
*3 z: as in z {$(Bi_{1/2}Na_{1/2})Nb_2O_6$}
*4 Piez.: Piezoelectricity

TABLE 2

| | x (*1) | y (*2) | z (*3) | 100 × Nb/(Nb +Ta) (%) | Phase | Tc (° C.) | Piez. |
|---|---|---|---|---|---|---|---|
| Ex. 47 | 0.75 | 0 | 0.25 | 5 | S | 170 | ○ |
| Ex. 48 | 0.75 | 0 | 0.25 | 10 | S | 150 | ○ |
| Ex. 49 | 0.75 | 0 | 0.25 | 20 | S | 120 | ○ |

Ex.: Example
*1 x: as in x [$Ba(Nb,Ta)_2O_6$]
*2 y: as in y [$Ca(Nb,Ta)_2O_6$]
*3 z: as in z {$(Bi_{1/2}Na_{1/2})(Nb,Ta)_2O_6$}
*4 Piez.: Piezoelectricity

TABLE 3

| | x (*1) | y (*2) | z (*3) | Mark | Phase | Tc (° C.) | Resistivity ($10^9$ Ωcm) | Piez. *4 |
|---|---|---|---|---|---|---|---|---|
| Ex. 33 | 0.8 | 0 | 0.2 | A' | M | 180 | 0.85 | Δ |
| Ex. 34 | 0.8 | 0.1 | 0.1 | B' | M | 200 | 1.1 | Δ |
| Ex. 35 | 0.7 | 0 | 0.3 | | S | 160 | 1.4 | ○ |
| Ex. 36 | 0.7 | 0.1 | 0.2 | | S | 190 | 2.9 | ○ |
| Ex. 37 | 0.7 | 0.2 | 0.1 | | S | 230 | 5.3 | ○ |
| Ex. 38 | 0.6 | 0 | 0.4 | | S | 50 | 16 | ○ |
| Ex. 39 | 0.6 | 0.1 | 0.3 | | S | 60 | 76 | ○ |
| Ex. 40 | 0.6 | 0.2 | 0.2 | | S | 70 | 35 | ○ |
| Ex. 41 | 0.6 | 0.3 | 0.1 | E' | M | 70 | — | Δ |
| Ex. 42 | 0.5 | 0.1 | 0.4 | | S | 60 | 170 | ○ |
| Ex. 43 | 0.5 | 0.2 | 0.3 | G' | M | — | — | Δ |
| Ex. 44 | 0.5 | 0.3 | 0.2 | F' | M | — | — | Δ |
| Ex. 45 | 0.4 | 0 | 0.6 | | S | — | — | Δ |
| Ex. 46 | 0.2 | 0 | 0.8 | | S | — | — | Δ |
| Co. Ex. 8 | 0 | 0 | 1 | I' | N | — | — | X |
| Co. Ex. 9 | 0 | 0.2 | 0.8 | H' | N | — | — | X |

Co. Ex.: Comparative Example
Ex.: Example
*1 x: as in x ($BaNb_2O_6$)
*2 y: as in y ($CaNb_2O_6$)
*3 z: as in z {$(Bi_{1/2}K_{1/2})Nb_2O_6$}
*4 Piez.: Piezoelectricity Sintered bodies having compositions represented by $x(BaNb_2O_6)$-$y(CaNb_2O_6)$-$z\{(Bi_{1/2}Na_{1/2})Nb_2O_6\}$, $x[Ba(Nb,Ta)_2O_6]$-$y[Ca(Nb,Ta)_2O_6]$-$z\{(Bi_{1/2}Na_{1/2})(Nb,Ta)_2O_6\}$ and $x(BaNb_2O_6)$-$y(CaNb_2O_6)$-$z\{(Bi_{1/2}K_{1/2})Nb_2O_6\}$ were prepared.

Barium carbonate, niobium oxide, tantalum oxide, calcium carbonate, bismuth oxide, sodium carbonate, and potassium nitrate powders were used as the raw materials. The powders were respectively weighed to achieve target compositions and mixed. Each powder mixture was calcined in air at 900° C. to 1100° C. for 2 to 5 hours. The calcined powder was ground and granulated by adding a binder. The resulting granules were charged in a die and compressed to form a compact. The compact was baked at 1000° C. to 1400° C. in air for 2 to 6 hours. When $(Bi_{1/2}Na_{1/2})Nb_2O_6$ was contained, the effect of lowering the sintering temperature needed to obtain a high-density piezoelectric material was observed. This tendency became more and more notable as the $(Bi_{1/2}Na_{1/2})Nb_2O_6$ content increased. The obtained sintered body was surface-polished to a thickness of about 1 mm. The polished sintered body or a powder obtained by grinding the polished sintered body was used to conduct X-ray diffraction analysis and to analyze the crystal phase. The sintered body was heated in air at 700° C. to 1000° C. for 1 hour to remove the organic matter on the surface. Then gold electrodes were formed on the front side and the back side of the sintered body by DC sputtering. The sintered body was then processed into a strip-shaped specimen and various electric characteristics of the specimen were evaluated.

Specimens with a preferred orientation were prepared by casting in a 1 to 10 T magnetic field. In particular, the calcined powder, water, and a dispersant were mixed to prepare a precursor. The precursor was casted while applying a magnetic field in a direction perpendicular to the thickness direction of the compact to form a (001) preferentially oriented specimen and while applying a magnetic field in a direction parallel to the thickness direction of the compact to form a (hk0) preferentially oriented specimen so as to control the crystal orientation. The resulting compact was removed from the die and baked in air at 1000° C. to 1400° C. for 2 to 6 hours. The resulting sintered body was surface-polished to a thickness of about 1 mm. The polished sintered body or a powder obtained by grinding the polished sintered body were used to conduct X-ray diffraction analysis and to analyze the crystal phase. The sintered body was heated in air at 700° C. to 1000° C. for 1 hour to remove the organic matter on the surface. Then gold electrodes were formed on the front side and the back side of the sintered body by DC sputtering. The sintered body was then processed into a strip-shaped specimen and various electric characteristics of the specimen were evaluated.

Table 1 shows the resistivity, the Curie temperature (Tc) measured by using a minute alternating electric field with a frequency of 1 MHz, the constitutional phase determined by the X-ray diffraction, and the piezoelectric property of the composition of the $x(BaNb_2O_6)$-$y(CaNb_2O_6)$-$z\{(Bi_{1/2}Na_{1/2})Nb_2O_6\}$ sintered body. Marks A to H correspond to the compositions shown in FIG. 3.

The piezoelectric property changed with the constitutional phase. Some specimens exhibited no piezoelectric property (marked by X in the table), some exhibited a weak piezoelectric property (marked by Δ in the table), and some exhibited a piezoelectric property suitable for device applications (marked by O in the table).

The constitutional phases (indicated as "Phase" in the tables) determined by the X-ray diffraction are also shown. In the tables, S indicates that the specimen has a tungsten bronze structure single phase, M indicates that the specimen has a tungsten bronze structure as the primary structure, and N indicates that the specimen has a non-tungsten bronze structure as the primary structure.

Table 1 shows that the insulation resistance of the material tends to improve with the $CaNb_2O_6$ content.

Figure 2A:
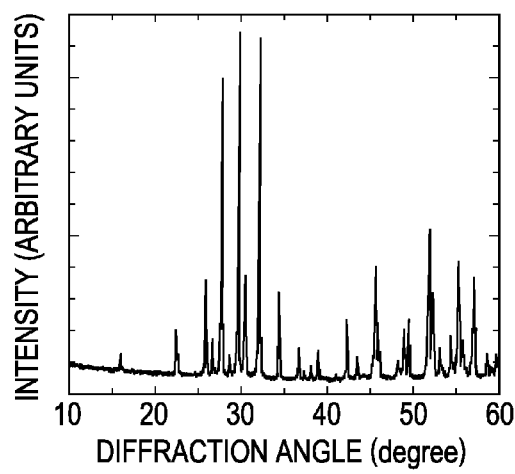
FIGS. 2A, 2B and 2C are X-ray diffraction patterns of tungsten bronze structure piezoelectric materials.

FIG. 2A is an X-ray diffraction pattern of a specimen having a tungsten bronze structure single phase, which is an example of the X-ray diffraction analysis of the constitutional phase. The specimen composition was $0.80(BaNb_2O_6)$-$0.20\{(Bi_{1/2}Na_{1/2})Nb_2O_6\}$ and the sintering temperature was 1300° C. The tungsten bronze structure obtained in the composition region x≥0.7 was mainly orthorhombic but was partly tetragonal in a region where the $CaNb_2O_6$ content was high. This result implies the existence of morphotropic phase boundary in this composition region.

Figure 2B:
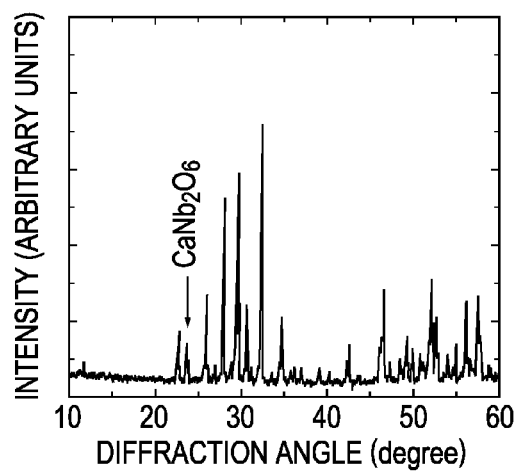

FIG. 2B is an X-ray diffraction pattern of a specimen having the tungsten bronze structure as the primary phase. The specimen composition was $0.40(BaNb_2O_6)$-$0.40(CaNb_2O_6)$-$0.20\{(Bi_{1/2}Na_{1/2})Nb_2O_6\}$ and the sintering temperature was 1300° C. Although a weak diffraction peak derived from $CaNb_2O_6$ was observed, other main peaks were derived from the tungsten bronze structure. $CaNb_2O_6$ and $BaNb_2O_6$, which are not a tungsten bronze structure, were frequently observed as the impurity phase following the primary phase.

Figure 2C:
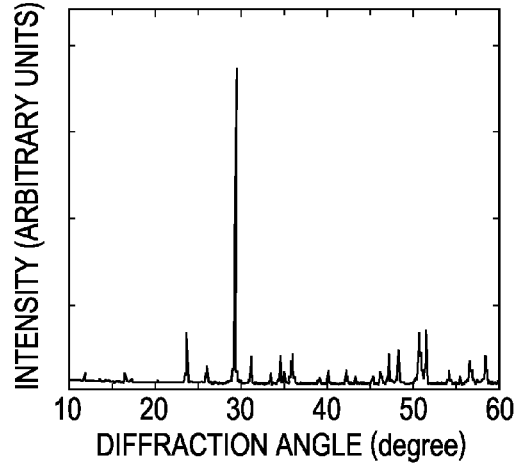

FIG. 2C is an X-ray diffraction pattern of a specimen in which substantially no tungsten bronze structure was observed. The specimen composition was $0.60(CaNb_2O_6)$-$0.40\{(Bi_{1/2}Na_{1/2})Nb_2O_6\}$ and the sintering temperature was 1300° C. Most of the observed diffraction peaks were attributed to $CaNb_2O_6$ structure, non tungsten bronze structure.

It was found that the Curie temperature of the piezoelectric material is room temperature (20° C.) or more and 500° C. or less. In particular, when compositions having a Curie temperature of 100° C. or more and 400° C. or less are selected and used in piezoelectric devices, loss of the piezoelectric properties do not occur until a very high temperature is reached. FIG. 3 is a ternary diagram that summarizes the constitutional phases of the $x(BaNb_2O_6)$-$y(CaNb_2O_6)$-$z\{(Bi_{1/2}Na_{1/2})Nb_2O_6\}$ sintered bodies. Solid circles in the ternary diagram indicate that all or nearly all of the constitutional phases of the sintered body had a tungsten bronze structure. Solid triangles in the ternary diagram indicate that the sintered body included two or more constitutional phases but the primary phase among these constitutional phases had a tungsten bronze structure. Solid squares indicate that substantially no tungsten bronze structure was observed as the constitutional phase of the sintered body.

When 0.2≤x≤0.85, 0≤y≤0.5, and 0<z≤0.8, sintered bodies including a primary phase having a tungsten bronze structure were obtained. It was confirmed that in the composition range satisfying 0.2≤x≤0.85, 0≤y≤0.5, and 0<z≤0.8 and surrounded by A, B, C, D, E, F, G and H below, a tungsten bronze structure single phase was observed:

(x y z)

A (0.85 0.00 0.15)
B (0.80 0.15 0.05)
C (0.70 0.25 0.05)
D (0.60 0.30 0.10)
E (0.50 0.30 0.20)
F (0.50 0.20 0.30)
G (0.20 0.20 0.60)
H (0.20 0.00 0.80)

The tungsten bronze structure remained as the primary phase even when the amount of the A site elements was adjusted to change the molar ratio of the A site elements to the B site element (A site/B site) within the range of 0.45 to 0.6. The tungsten bronze structure remained as the primary phase even when the molar ratio of Bi to Na (Bi/Na) was changed within the range of 0.9 to 1.1. The tungsten bronze structure remained as the primary phase when up to 20% of Nb occupying the B site was replaced by Ta as shown in Table 2. It was thus found that the tungsten bronze structure is maintained and the piezoelectricity is not lost even when there is a slight deviation in the molar ratio of the A site elements to the B site element.

With respect to the compositions above, preferably $x+y+z=1$, $0.6 \leq x \leq 0.85$, $0 < y \leq 0.4$, and $0 < z \leq 0.4$. This is because the insulating resistance of the material improves due to $CaNb_2O_6$.

Figure 4:
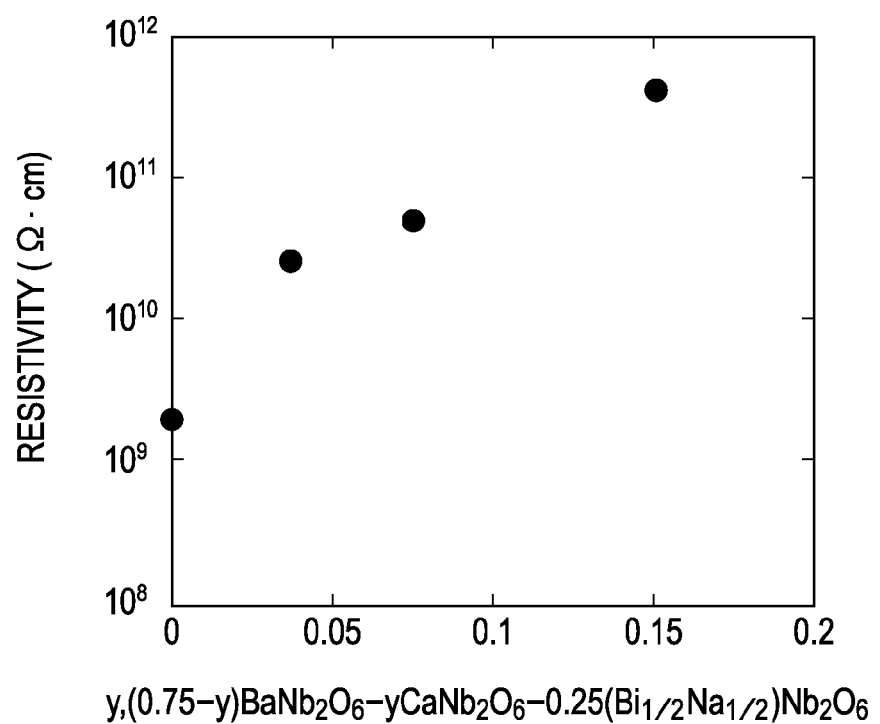
FIG. 4 is a diagram showing the composition and resistivity of a piezoelectric material.

FIG. 4 shows the relationship between the resistivity and the composition of a $x(BaNb_2O_6)$-$y(CaNb_2O_6)$-$0.25\{(Bi_{1/2}Na_{1/2})Nb_2O_6\}$ sintered body. The horizontal axis indicates y. The graph shows that the insulating resistance of the material improves with the increase in $CaNb_2O_6$ content.

The mechanical quality factor (Qm) of the $x(BaNb_2O_6)$-$y(CaNb_2O_6)$-$z\{(Bi_{1/2}Na_{1/2})Nb_2O_6\}$ sintered body was evaluated. A mechanical quality factor of 300 or more was observed in a region where good piezoelectric properties are achieved.

In order to polarize a specimen having a degree of orientation in the c axis direction in terms of Lotgering factor of less than 0.07, the specimen had to be retained in an oil bath at 150° C. to 200° C. and a DC voltage of about 30 kV/cm or more had to be applied to the specimen. The intensity of the DC voltage needed to polarize specimens having a Lotgering factor of 0.07 or more and less than 0.2 was about 25 kV/cm or more. The intensity of the DC voltage needed to polarize specimens having a Lotgering factor of 0.2 or more was 20 kV/cm or more.

FIGS. 5A to 5D show polarization-electric field hysteresis loops of $0.80(BaNb_2O_6)$-$0.00(CaNb_2O_6)$-$0.2\{(Bi_{1/2}Na_{1/2})Nb_2O_6\}$ and $0.75(BaNb_2O_6)$-$0.00(CaNb_2O_6)$-$0.25\{(Bi_{1/2}Na_{1/2})Nb_2O_6\}$ sintered bodies measured at room temperature. A (001) preferentially oriented specimen (FIGS. 5A and 5C) displayed clear hysteresis loops. However, a (hk0) preferentially oriented specimen (FIGS. 5B and 5D) displayed a polarization that changes linearly versus the electric field. No clear polarization hysteresis was observed when an electric field having about the same intensity as that applied to the (001) preferentially oriented specimen was applied to the (hk0) preferentially oriented specimen. This anisotropy in polarization characteristics observed between the (001) and (hk0) preferentially oriented specimens is largely dependent on the relationship between the spontaneous polarization axis direction and the direction of the applied electric field. For the (001) preferentially oriented specimen, since the spontaneous polarization axis direction is parallel to the applied electric field, switching of the spontaneous polarization occurred due to the external electric field. In contrast, for the (hk0) preferentially oriented specimen, presumably since the spontaneous polarization axis direction is perpendicular to the applied electric field, the external electric field could not switch the spontaneous polarization. These results show that the specimens indicated in FIGS. 5A to 5D have a spontaneous polarization axis direction parallel to the c axis.

Figure 5A:
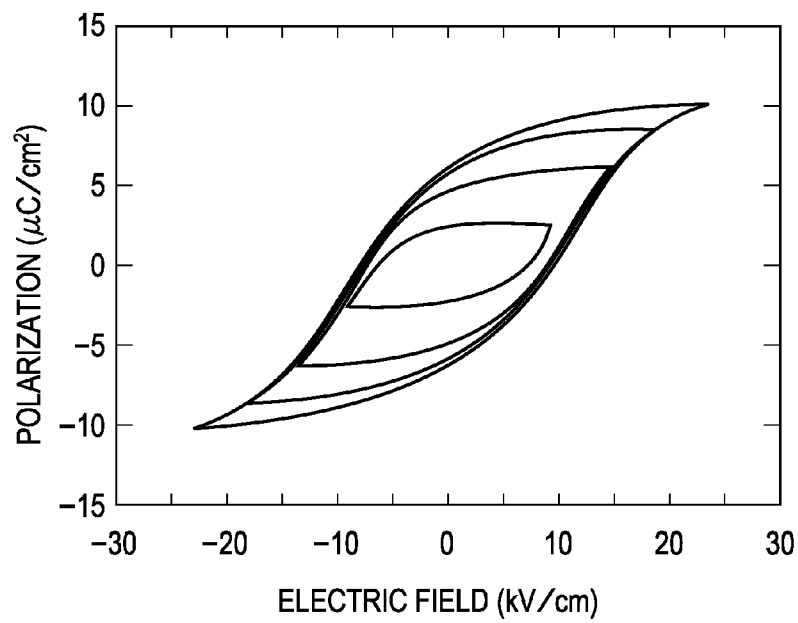
FIGS. 5A, 5B, 5C, 5D, 5E, and 5F are graphs showing polarization-electric field hysteresis loops of tungsten bronze structure piezoelectric materials measured at a frequency of 500 Hz.
Figure 5B:
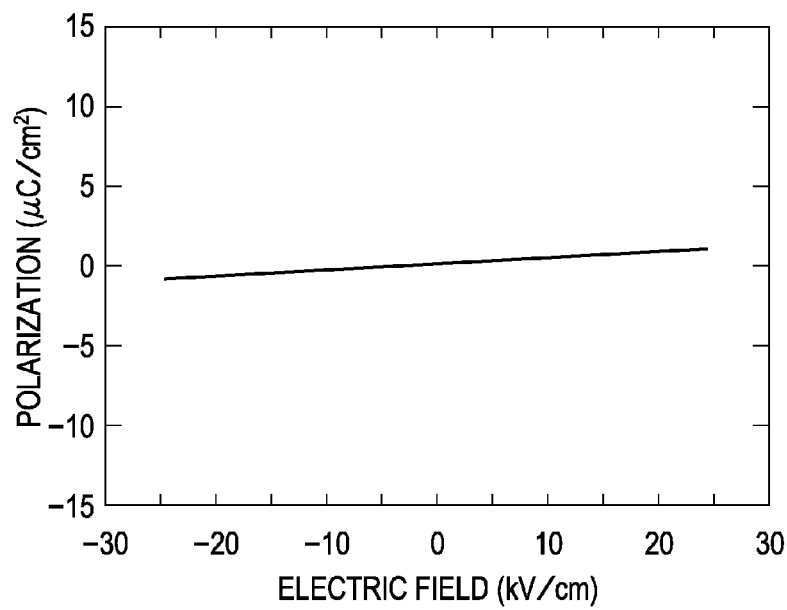
Figure 5C:
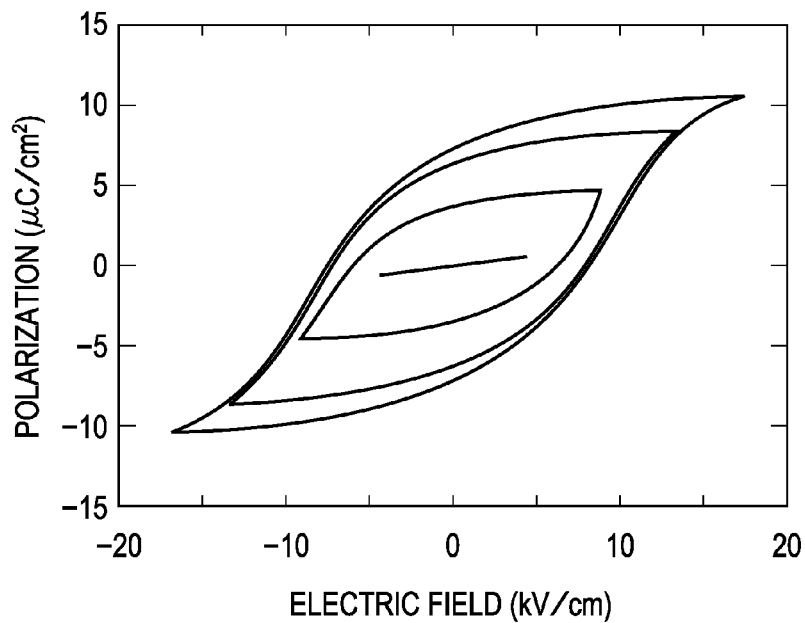
Figure 5D:
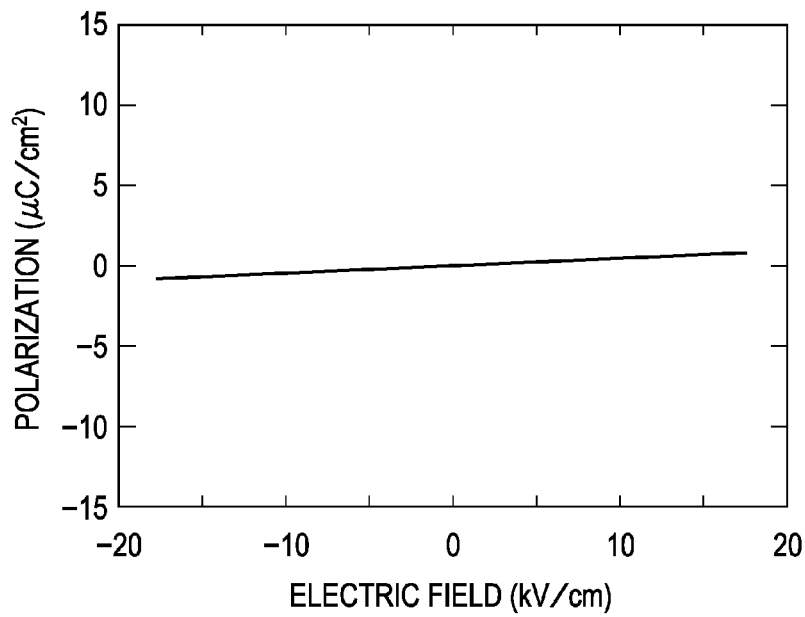
Figure 5E:
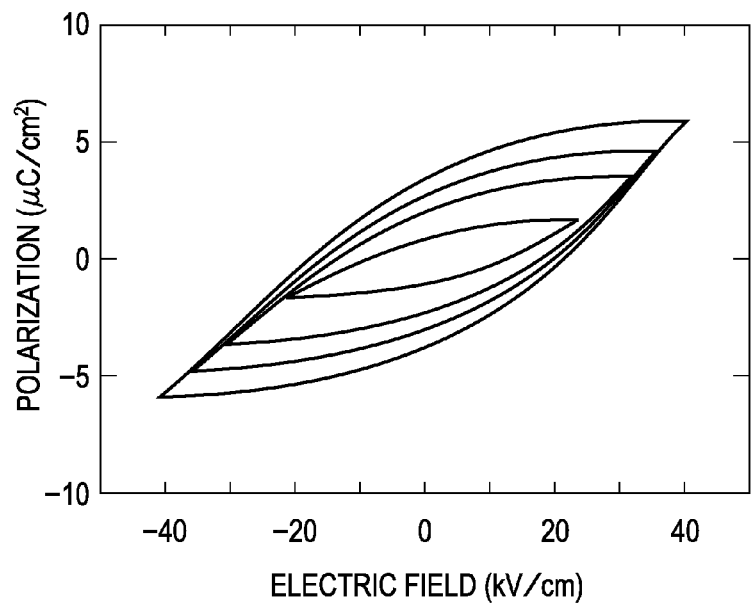
Figure 5F:
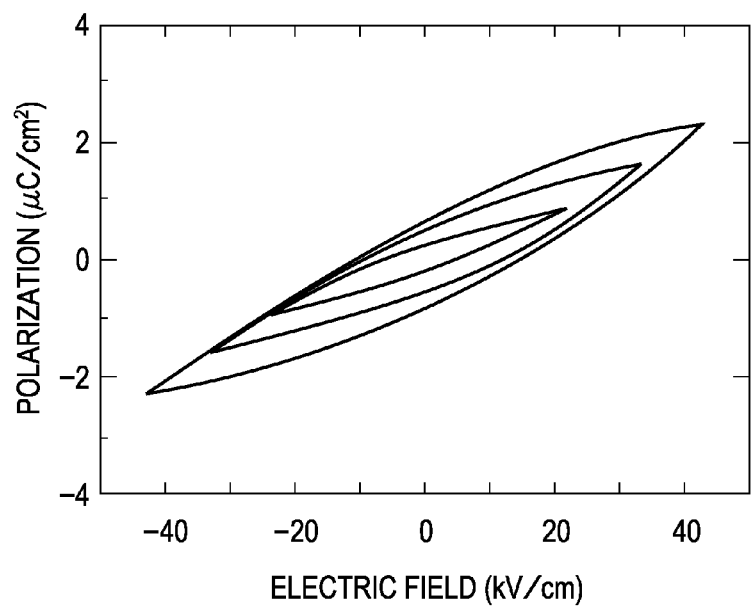

The polarization-electric field hysteresis loop of $0.75(BaNb_2O_6)$-$0.05(CaNb_2O_6)$-$0.2\{(Bi_{1/2}Na_{1/2})Nb_2O_6\}$ sintered bodies was measured at room temperature. Both the (001) preferentially oriented specimen (FIG. 5E) and the (hk0) preferentially oriented specimen (FIG. 5F) displayed hysteresis loops, which showed that the spontaneous polarization axis was inclined with respect to the c axis direction. The saturation polarization determined by drawing a tangent line to the polarization-electric field hysteresis loop of the (001) preferentially oriented specimen (FIG. 5E) was 5.0 $\mu C/cm^2$.

The saturation polarization of the (hk0) preferentially oriented specimen (FIG. 5F) was 1.2 $\mu C/cm^2$. The ratio of the saturation polarization of the (001) preferentially oriented specimen to the saturation polarization of the (hk0) preferentially oriented specimen was 4.2. This indicates that the spontaneous polarization axis of this composition is inclined by about 13 degrees with respect to the c axis direction. However, this value may change according to the composition, the frequency used for measuring the hysteresis loop, the insulating property of the specimen, and the method for estimating the saturation polarization.

For the reasons described above, the degree to which the spontaneous polarization axis direction deviates from the c axis is increased and the piezoelectric properties are further improved within the composition range of $0.7 \leq x \leq 0.85$, $0 < y \leq 0.4$, and $0 < z \leq 0.4$. The tungsten bronze structure oxides within this composition range contain 1 to 12 wt % of Bi.

Another example of the piezoelectric material will now be described. This piezoelectric material differs from the piezoelectric material described above in that $Na_{1/2}$ is replaced with $K_{1/2}$.

Figure 6:
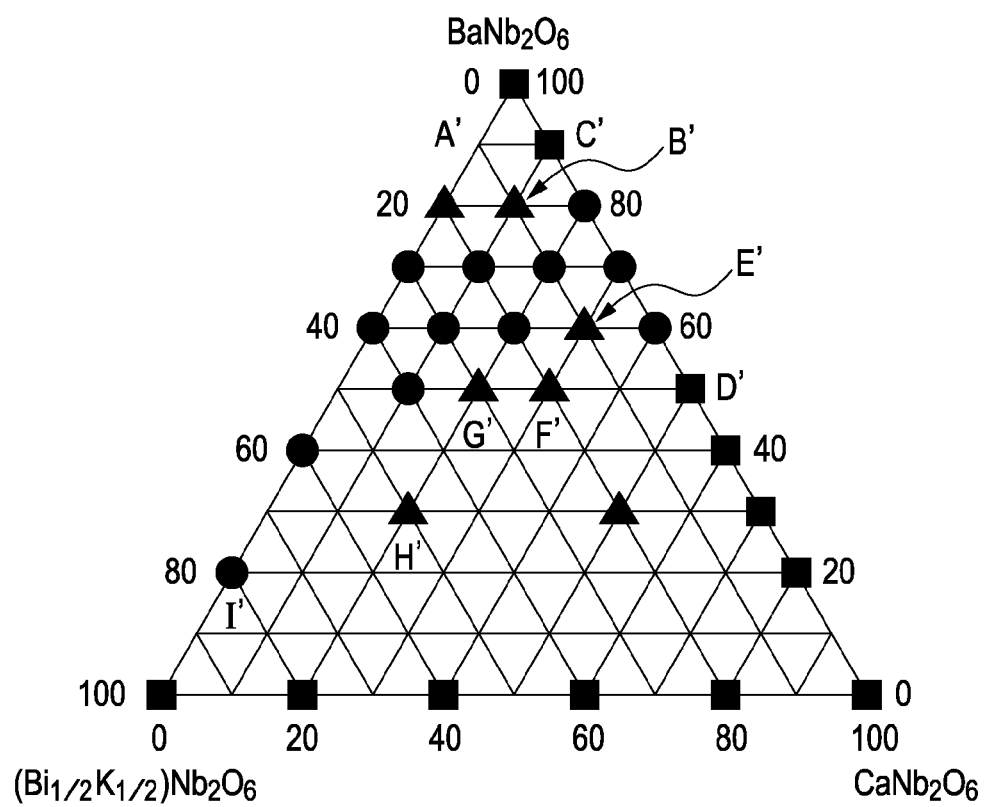
FIG. 6 is a diagram showing the composition and constitutional phases of another piezoelectric material.

The constitutional phases of $x(BaNb_2O_6)$-$y(CaNb_2O_6)$-$z\{(Bi_{1/2}K_{1/2})Nb_2O_6\}$ sintered bodies are summarized in FIG. 6. Solid circles, triangles, and squares have the same definitions as in FIG. 3. Sintered bodies having a tungsten bronze structure primary phase were obtained within the range of $0.2 \leq x \leq 0.85$, $0 \leq y \leq 0.5$, and $0 < z \leq 0.8$. It was confirmed that in the composition range satisfying $0.2 \leq x \leq 0.85$, $0 \leq y \leq 0.5$, and $0 < z \leq 0.8$ and surrounded by A', B', C', D', E', F', G', H', and I' below, a tungsten bronze structure single phase was observed:

(x y z)
A' (0.80 0.00 0.20)
B' (0.80 0.10 0.10)
C' (0.90 0.10 0.00)
D' (0.50 0.50 0.00)
E' (0.60 0.30 0.10)
F' (0.50 0.30 0.20)
G' (0.50 0.20 0.30)
H' (0.30 0.20 0.50)
I' (0.20 0.00 0.80)

Table 3 shows the compositions and evaluation results of $x(BaNb_2O_6)$-$y(CaNb_2O_6)$-$z\{(Bi_{1/2}K_{1/2})Nb_2O_6\}$. The items of evaluation were the same as those shown in Table 1. Marks A' to I' correspond to the compositions shown in FIG. 6.

Table 3 shows that the insulating resistance of the material tends to improve with the $CaNb_2O_6$ content.

Furthermore, some specimens exhibited no piezoelectric property (marked by X in Table 3), some exhibited a weak piezoelectric property (marked by Δ in Table 3), and some exhibited a piezoelectric property suitable for device applications (marked by O in Table 3).

Liquid discharge heads and ultrasonic motors shown in FIGS. 1A to 1D manufactured using piezoelectric materials represented by $0.8(BaNb_2O_6)$-$0.05(CaNb_2O_6)$-$0.15\{(Bi_{1/2}Na_{1/2})Nb_2O_6\}$, $0.75(BaNb_2O_6)$-$0.00(CaNb_2O_6)$-$0.25\{(Bi_{1/2}Na_{1/2})Nb_2O_6\}$, and $0.7(BaNb_2O_6)$-$0.2(CaNb_2O_6)$-$0.1\{(Bi_{1/2}K_{1/2})Nb_2O_6\}$ for trial exhibited good characteristics.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-111123, filed Apr. 30, 2009, which is hereby incorporated by reference herein in its entirety.

INDUSTRIAL APPLICABILITY

A piezoelectric material according to aspects of the present invention displays good piezoelectric properties at high ambient temperature and is environmentally friendly. Thus, the piezoelectric material can be used in appliances that use many piezoelectric materials, such as liquid discharge heads, ultrasonic motors, and piezoelectric devices.

The invention claimed is:

1. A compound comprising a lead-free tungsten bronze structure oxide represented by general formula (1):

$$x(BaB_2O_6)\text{-}y(CaB_2O_6)\text{-}z\{(Bi_{1/2}C_{1/2})B_2O_6\} \qquad (1)$$

where B represents at least one of Nb and Ta; C represents at least one of Na and K; x+y+z=1; 0.2≤x≤0.85; 0<y≤0.5; and 0<z≤0.8.

2. The compound according to claim 1, wherein B in general formula (1) represents Nb and C represents Na.

3. The compound according to claim 1, wherein (x y z) in general formula (1) is within a composition range surrounded by A, B, C, D, E, F, G, and H below:

(x y z)
A (0.80 0.05 0.15)
B (0.80 0.15 0.05)
C (0.70 0.25 0.05)
D (0.60 0.30 0.10)
E (0.50 0.30 0.20)
F (0.50 0.20 0.30)
G (0.20 0.20 0.60)
H (0.30 0.10 0.60).

4. The compound according to claim 1, wherein a degree of (001) orientation in terms of Lotgering factor determined by X-ray diffraction analysis is 0.07 or more and 1.00 or less.

5. The compound according to claim 1, wherein a Curie temperature is 100° C. or more and 400° C. or less.

6. A compound comprising a lead-free tungsten bronze structure oxide containing Bi and having a spontaneous polarization axis inclined with respect to a c axis of a unit cell.

7. A piezoelectric material comprising the compound according to claim 1.

8. A piezoelectric device comprising a first electrode, a piezoelectric material, and a second electrode, wherein the piezoelectric material is the piezoelectric material according to claim 7.

9. A liquid discharge head comprising the piezoelectric device according to claim 8.

10. An ultrasonic motor comprising the piezoelectric device according to claim 8.

11. The compound according to claim 6, wherein
the compound comprises a lead-free tungsten bronze structure oxide represented by general formula (1):

$$x(BaB_2O_6)\text{-}y(CaB_2O_6)\text{-}z\{(Bi_{1/2}C_{1/2})B_2O_6\} \qquad (1)$$

where B represents at least one of Nb and Ta; C represents at least one of Na and K; x+y+z=1; 0.2≤x≤0.85; 0<y≤0.5; and 0<z≤0.8.

* * * * *